(12) United States Patent
Kim et al.

(10) Patent No.: US 6,759,714 B2
(45) Date of Patent: Jul. 6, 2004

(54) SEMICONDUCTOR DEVICE HAVING HEAT RELEASE STRUCTURE USING SOI SUBSTRATE AND FABRICATION METHOD THEREOF

(75) Inventors: Sang Gi Kim, Daejon (KR); Dae Woo Lee, Daejon (KR); Tae Moon Roh, Daejon (KR); Yil Suk Yang, Daejon (KR); Il-Young Park, Daejon (KR); Byoung-Gon Yu, Daejon (KR); Jong Dae Kim, Daejon (KR)

(73) Assignee: Electronics and Telecommunications Research Institute, Daejon (KR)

( * ) Notice: Subject to any disclaimer, the term of this patent is extended or adjusted under 35 U.S.C. 154(b) by 0 days.

(21) Appl. No.: 10/322,232

(22) Filed: Dec. 17, 2002

(65) Prior Publication Data

US 2004/0084726 A1 May 6, 2004

(30) Foreign Application Priority Data

Nov. 1, 2002 (KR) .......................................... 2002-67479

(51) Int. Cl.⁷ .............................................. H01L 29/72
(52) U.S. Cl. ......................... 257/347; 257/349; 257/355
(58) Field of Search ................................ 257/347, 349, 257/355

(56) References Cited

U.S. PATENT DOCUMENTS 6,245,600 B1    6/2001   Geissler et al.
6,429,486 B1    8/2002   Abe et al.
6,570,217 B1 *  5/2003   Sato et al. .................. 257/327

FOREIGN PATENT DOCUMENTS

KR    1020000045286    7/2000

* cited by examiner

Primary Examiner—Edward Wojciechowicz
(74) Attorney, Agent, or Firm—Blakely, Sokoloff, Taylor & Zafman

(57) ABSTRACT

Provided is a semiconductor fabrication technology; and, more particularly, to a semiconductor device having a heat release structure that uses a silicon-on-insulator (SOI) substrate, and a method for fabricating the semiconductor device. The device and method of the present research provides a semiconductor device having a high heat-release structure and high heat-release structure, and a fabrication method thereof. In the research, the heat and high-frequency noises that are generated in the integrated circuit are released outside of the substrate through the tunneling region quickly by forming an integrated circuit on a silicon-on-insulator (SOI) substrate, aiid removing a buried insulation layer under the integrated circuit to form a tunneling region. The heat-release efficiency can be enhanced much more, when unevenness is formed on the surfaces of the upper and lower parts of the tunneling region, or when the air or other gases having excellent heat conductivity is flown into the tunneling region.

16 Claims, 9 Drawing Sheets

SEMICONDUCTOR DEVICE HAVING HEAT RELEASE STRUCTURE USING SOI SUBSTRATE AND FABRICATION METHOD THEREOF

FIELD OF THE INVENTION

The present invention relates to a semiconductor fabrication technology; and, more particularly, to a semiconductor device having a heat release structure that uses a silicon-on-insulator (SOI) substrate, and a method for fabricating the semiconductor device.

DESCRIPTION OF RELATED ART

The operation of a semiconductor device inevitably generates heat. Semiconductor devices that consume much electric power, such as power devices and high-frequency devices, generate a lot of heat when they are operated. The heat not only degrades the performance of the semiconductor devices, but also has a negative effect on the other neighboring circuits.

The heat is originated from the resistance component inside the semiconductor devices. To reduce the heat generation, the wires and contacts should be formed of low-resistant materials. However, this idea has a limit in suppressing the heat generation due to the limit in designing and processing.

Conventionally, a heat-releasing plate is attached to the rear surface of a substrate in the lower part of an integrated circuit (IC), when a semiconductor device is packaged.

FIG. 1 is a cross-sectional view showing a conventional semiconductor device having a heat release structure. Referring to FIG. 1, the conventional semiconductor device having a heat-releasing structure includes: a silicon-on-insulator (SOI) substrate 10 formed of a bottom silicon substrate 11, a buried oxide 12 and a top silicon layer 13; an IC 14 formed on the top silicon layer 13 of the SOI substrate 10; and a gold-plated material layer 15 on the rear surface of the bottom silicon substrate 11.

Here, if the thickness of the bottom silicon substrate 11 is maintained by the thickness of a wafer, the heat-releasing effect is deteriorated. So, the rear surface of the bottom silicon substrate 11 is polished to be thin and gold-plated.

Meanwhile, although FIG. 1 shows an example where the IC 14 is formed on the SOI substrate 10, the processes of polishing the rear surface and gold plating can be applied to a case where the IC is formed on a bulk silicon substrate, too.

However, No matter what silicon substrate is used, i.e., bulk silicon substrates and SOI substrates alike, the conventional method deteriorates the heat-releasing efficiency, because the substrate itself releases the heat. Particularly, when the SOI substrate 10 is used, the heat-releasing efficiency drops more due to the low heat conductivity of a buried oxide 12, compared to when the bulk silicon substrate is used.

SUMMARY OF THE INVENTION

It is, therefore, an object of the present invention to provide a semiconductor device having a heat-releasing structure with high heat-releasing efficiency, and a method for fabricating the semiconductor device.

In accordance with an aspect of the present invention, there is provided a semiconductor device, comprising: a silicon-on-insulator (SOI) substrate including a bottom silicon substrate, a buried insulation layer, and a top silicon layer; an integrated circuit formed on the top silicon layer of the SOI substrate; and a tunneling region formed between the bottom silicon substrate and the top silicon layer, which are under the integrated circuit.

In accordance with another aspect of the present invention, there is provided a method for fabricating a semiconductor device, comprising the steps of: preparing an SOI substrate including a bottom silicon substrate, a buried insulation layer and a top silicon layer; forming an integrated circuit on the top silicon layer of the SOI substrate; and forming a tunneling region between the bottom silicon substrate and the top silicon layer, which are under the integrated circuit.

The semiconductor device fabrication method of the present invention forms an integrated circuit (IC) on a silicon-on-insulator (SOI) substrate, and forms a tunneling region by removing the buried insulation layer in the lower part of the IC to thereby release the heat and high-frequency noise generated in the IC to the outside of the substrate quickly through the tunneling region. In the mean time, the heat-releasing efficiency can be improved more by flowing air or gases having high heat conductivity to the tunneling region, or by forming unevenness on the surface of the upper and lower part of the tunneling region.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE INVENTION

Other objects and aspects of the invention will become apparent from the following description of the embodiments with reference to the accompanying drawings, which is set forth hereinafter.

Figure 1:
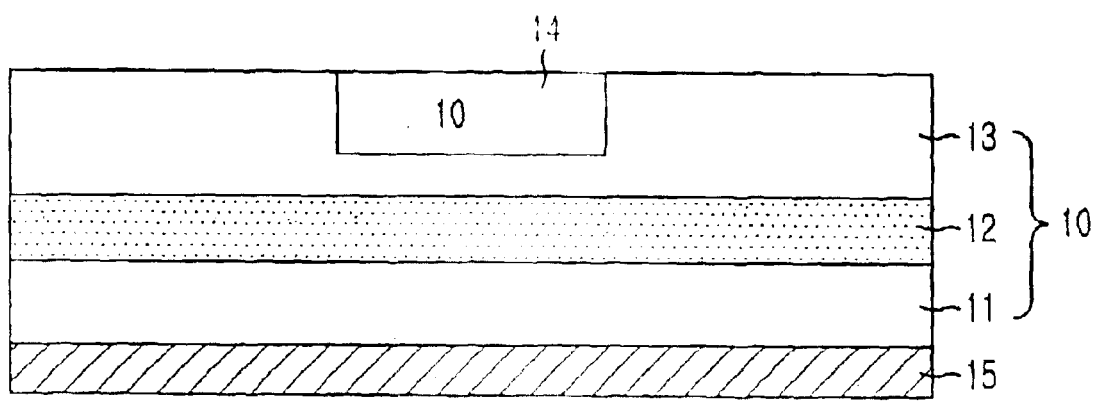
FIG. 1 is a cross-sectional view showing a conventional semiconductor device having a heat release structure.
Figure 2:
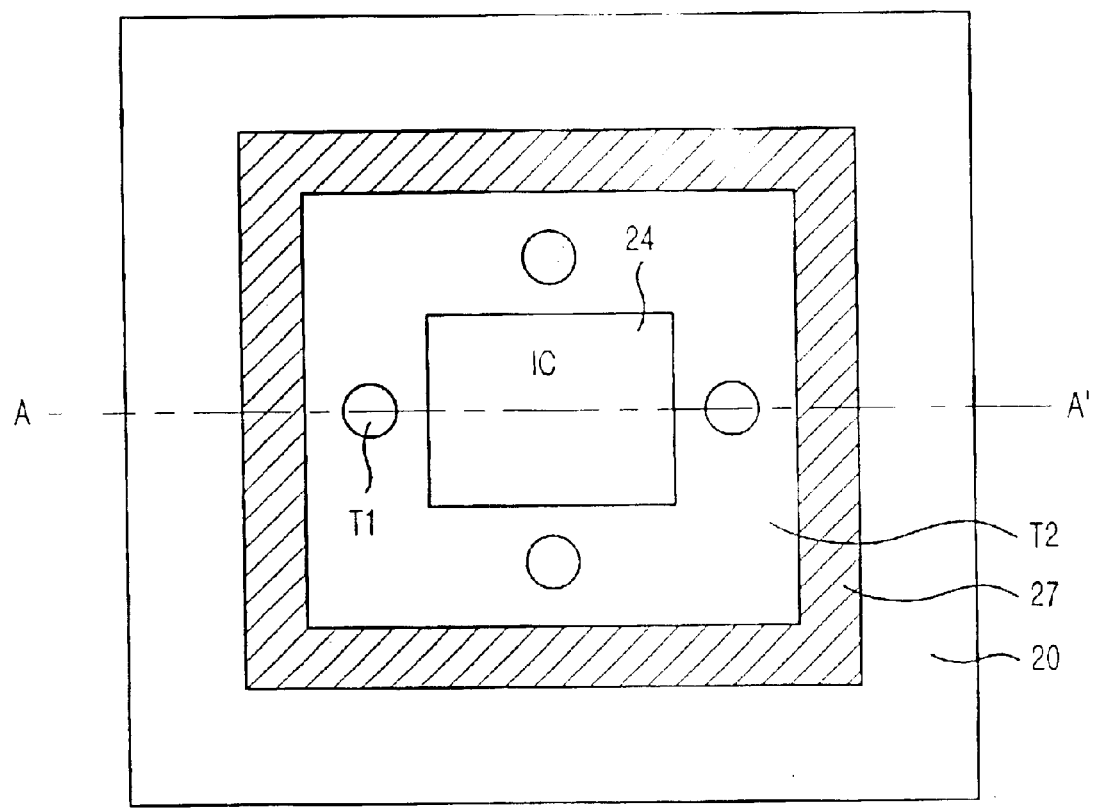
FIG. 2 is a layout describing a semiconductor device having a heat release structure in accordance with an embodiment of the present invention.
Figure 3:
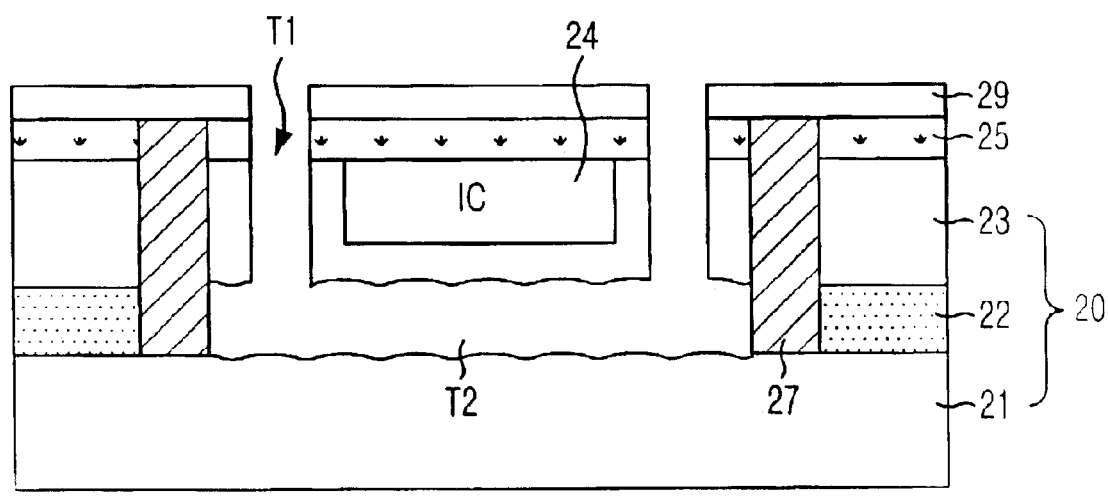
FIG. 3 is a cross-sectional view showing the semiconductor device of FIG. 2 severed along the line A–A'.

FIG. 2 is a layout describing a semiconductor device having a heat release structure in accordance with an embodiment of the present invention, and FIG. 3 is a cross-sectional view showing the semiconductor device of FIG. 2 severed along the line A–A'.

Referring to FIGS. 2 and 3, the semiconductor device having a heat-releasing structure in accordance with an embodiment of the present invention includes: a silicon-on-insulator (SOI) substrate 20 having a bottom silicon substrate 21, a buried oxide 22 and a top silicon layer 23; an integrated circuit (IC) 24 formed on the top silicon layer 23 of the SOI substrate 20; a polysilicon layer 27 inserted in the buried oxide 22 and top silicon layer 23 around the IC 24 at a predetermined interval; a silicon oxide layers 25 and 29 formed on the top of the SOI substrate 20; a tunneling region T2 formed in the lower part of the IC 24 inside the region defined by the polysilicon layer 27; and one or more trench regions T1 that penetrates the top silicon layer 23 and silicon oxide layers 25 and 29 between the polysilicon layer 27 and the IC 24 to expose the tunneling region T2.

Here, the air or other gases having high heat conductivity may be flown into the trench regions T1 and the tunneling region T2. The trench regions T1 may be expected to work as a heat-releasing exit. However, it may be regarded as nothing more than a by-product generated in the process of removing the buried oxide 22 to form the tunneling region T2. The polysilicon layer 27 works as a barrier layer (i.e., etching barrier layer) in the process of removing the buried oxide 22 to form the tunneling region T2, rather than works as a conductor layer.

The semiconductor device of the present invention releases out the heat generated not only in the silicon substrate 21 but also in the IC 24 through the tunneling region T2 end the trench regions T1 more quickly. In the conventional technology, a semiconductor device has the buried oxide 22 in the lower part of the IC 24. Since the buried oxide 22 has low heat conductivity, the efficiency of releasing heat to the lower part of the substrate is low. However, since the embodiment of the present invention does not have the buried oxide 22 in the lower part of the IC 24, the heat release efficiency towards the lower part of the substrate can be improved.

Meanwhile, unevenness can be formed on the upper and lower surfaces of the tunneling region T2, as illustrated in the drawing. If the upper and lower surfaces of the tunneling region T2 are formed uneven, the surface area that can release heat becomes wider, and thus the heat release efficiency is increased. One other method that can increase the heat release efficiency is to perform metal coating on the trench region T1 and the tunneling region T2.

FIGS. 2 and 3 show an example where the entrance of the trench region T1 is open. However, depending on cases, the entrance of the trench region T1 may be closed. If the entrance is closed, the air or gases having excellent heat conductivity can be filled in the trench region T1 and the tunneling region T2. When the entrance is closed, the heat release efficiency may drop, compared to a case where the entrance of the trench region T1 is open. However, since the buried oxide 22 does not exist in the lower part of the IC 24, the heat-release efficiency towards the lower part of the substrate is more excellent than the conventional technology. Therefore, the ICs releasing a lot of heat use the structure of opening the entrance of the trench region T1, and the ICs releasing rather a small amount of heat use the structure of closing the entrance of the trench region T1.

Figure 4A:
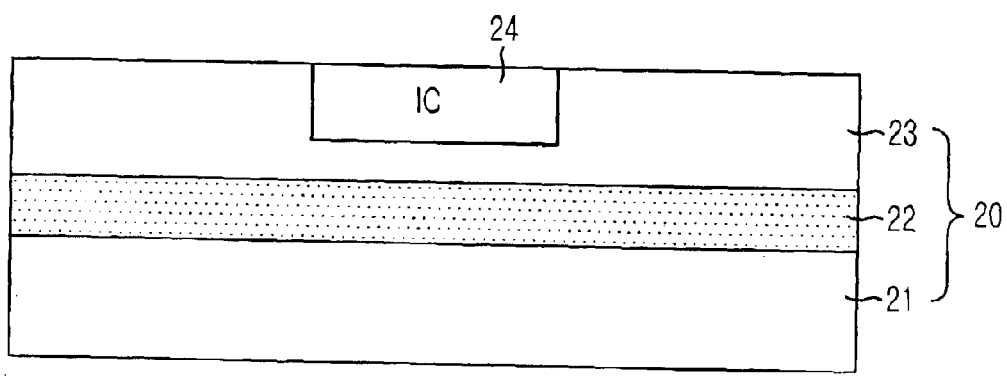
FIGS. 4A to 4K are cross-sectional views illustrating the fabrication method of the semiconductor device shown in FIG. 2.

FIGS. 4A to 4K are cross-sectional views illustrating the fabrication method of the semiconductor device shown in FIG. 2. Referring to FIG. 4A, the semiconductor device fabrication method of the present invention forms the IC 24 on the SOI substrate 20. The SOI substrate 20 includes a bottom silicon substrate 21, a buried oxide 22 and a top silicon layer 23 piled in order. To form the IC 24, such as power device or high-frequency device, a well and a plurality of transistors are formed on the top silicon layer 23.

Figure 4B:
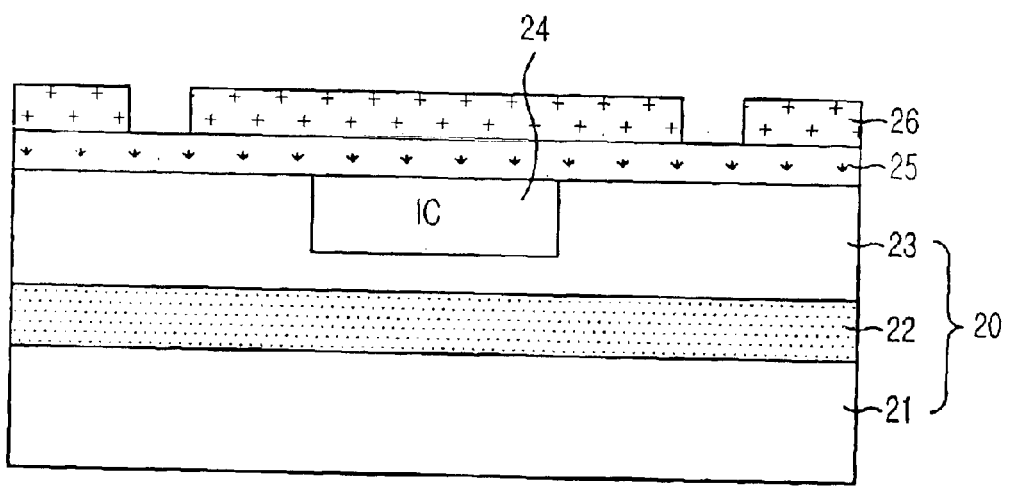

Referring to FIG. 4B, a silicon oxide layer 25 is deposited as a protection layer on the top of the entire structure, and then a photoresist pattern 26 is formed thereon through a lithography process. Here, the silicon oxide layer 25 can be replaced by another insulation layer, such as a silicon nitride, polymer and polyimide. The photoresist pattern 26 is formed to expose the silicon oxide layer 25 neighboring the IC 24 in a predetermined width (see FIG. 2).

Figure 4C:
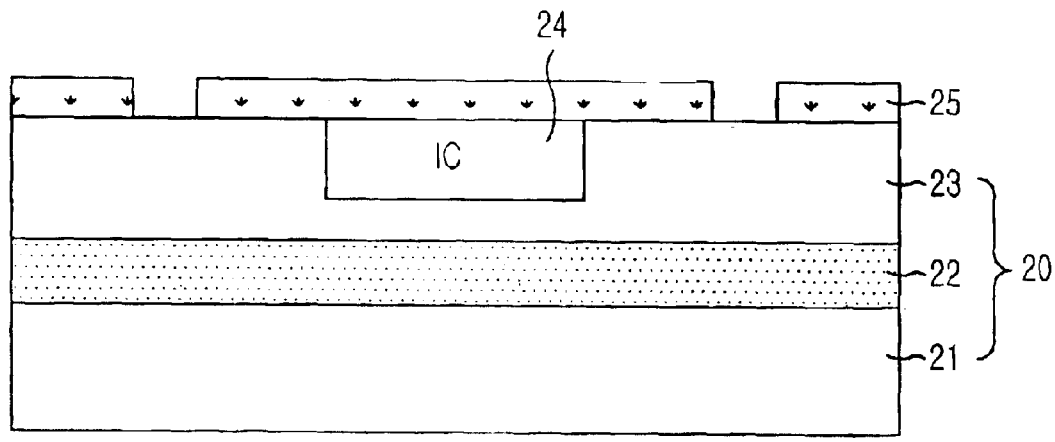

Referring to FIG. 4C, the exposed silicon oxide layer 25 is etched sing the photoresist pattern 26 as an etching mask. Then, the remaining photoresist pattern 26 is removed.

Figure 4D:
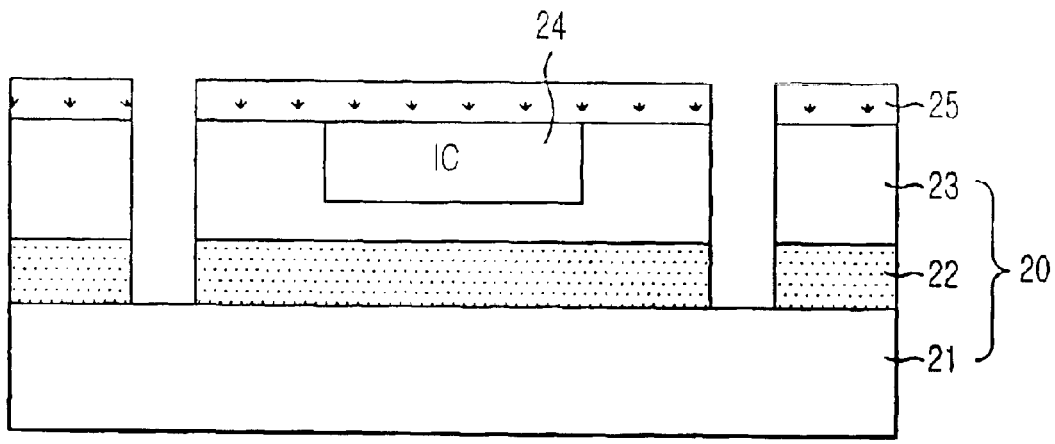

Referring to FIG. 4D, the top silicon layer 23 and the buried oxide 22 are etched using the patterned silicon oxide layer 25 as an etching mask. Here, the bottom silicon substrate 21 is exposed in the bottom of the trench, which is formed by etching.

Figure 4E:
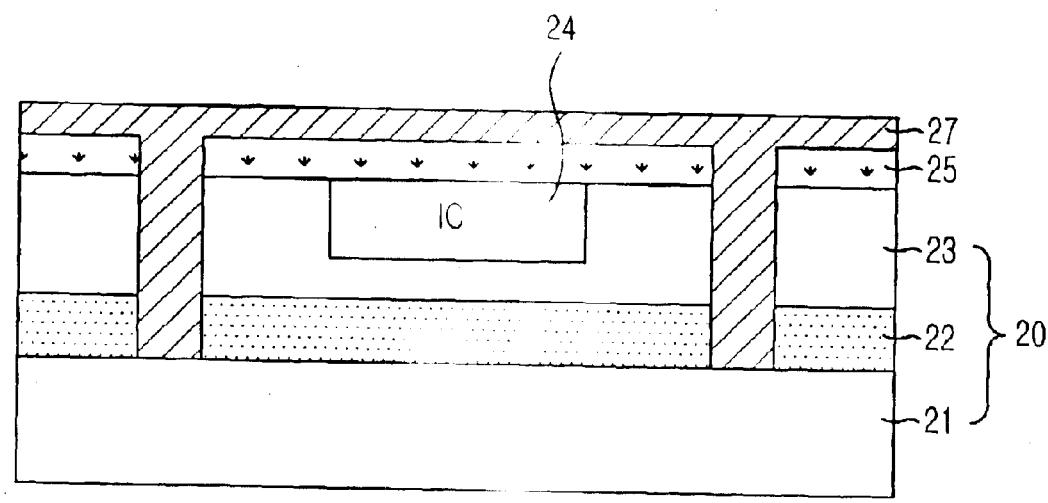

Referring to FIG. 4E, the inside of the trench is filled up by depositing a polysilicon layer 27. The polysilicon layer 27 can be applied to both doped state and un-doped state, and it can be substituted by other metallic material or insulation material.

Figure 4F:
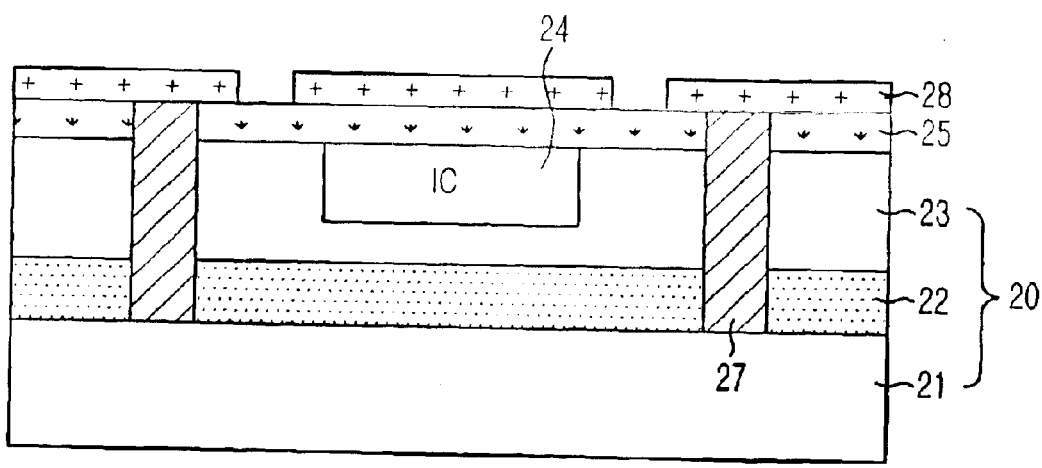

Referring to FIG. 4F, the polysilicon layer 27 on the top of the silicon oxide layer 25 is removed by performing a chemical mechanical polishing (CMP) or etch-back process. Then, a photoresist pattern 28 is formed through a lithography process. The photoresist pattern 28 has one or more openings (see FIG. 2) having an isolated pattern between the trench region where the polysilicon layer 27 is filled and the IC 24. The shape of the photoresist pattern 28 is not significant.

Figure 4G:
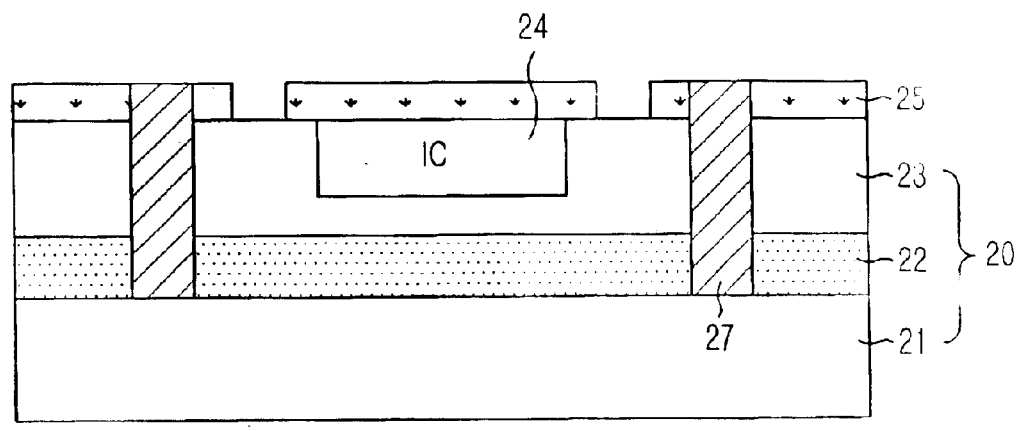

Referring to FIG. 4G, the silicon oxide layer 25 is etched using the photoresist pattern 28 as an etching mask.

Figure 4H:
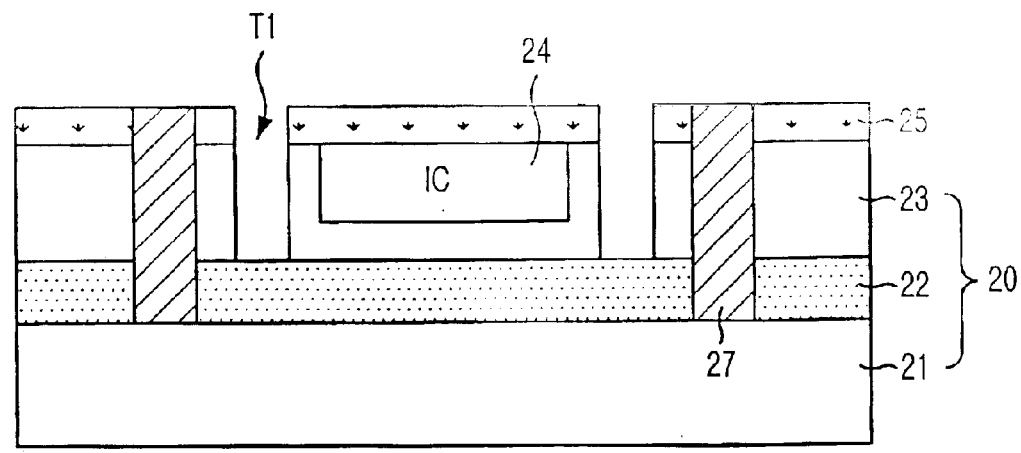

Referring to FIG. 4H, the photoresist pattern 28 is removed, and the top silicon layer 23 is etched to form the trench region T1, using the patterned silicon oxide layer 25 as an etching mask.

Figure 4I:
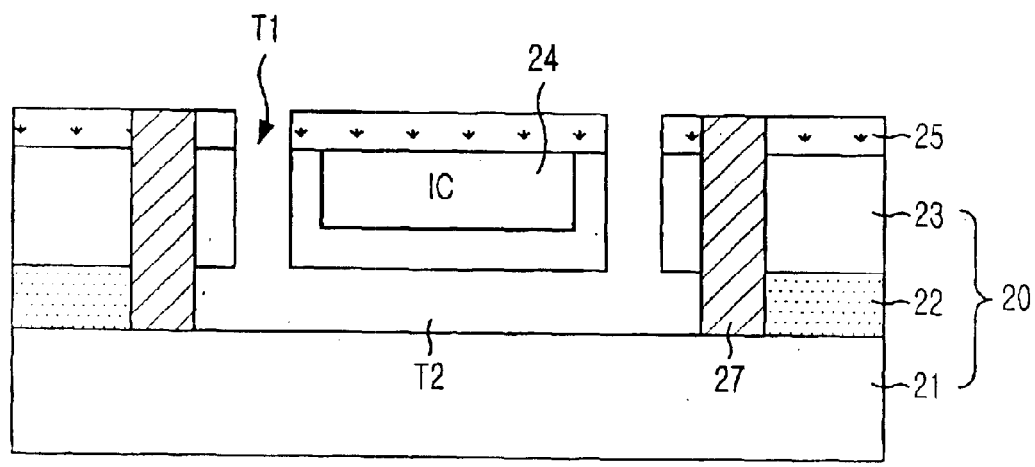

Referring to FIG. 4I, the buried oxide 22 inside a region defined by the polysilicon layer 27 is removed to form the tunneling region T2. Here, when the buried oxide 22 is removed, a gas phase etching method using such gases as HF and BHF may be used. Since the polysilicon layer 27 performs the role of an etching barrier layer, only the buried oxide 22 inside the region defined by the polysilicon layer 27 can be removed. Meanwhile, when part of the buried oxide 22 inside the region defined by the polysilicon layer 27 remains, the remaining buried oxide 22 can work as a pillar that supports the top silicon layer 23, where the IC 24 is formed.

Figure 4J:
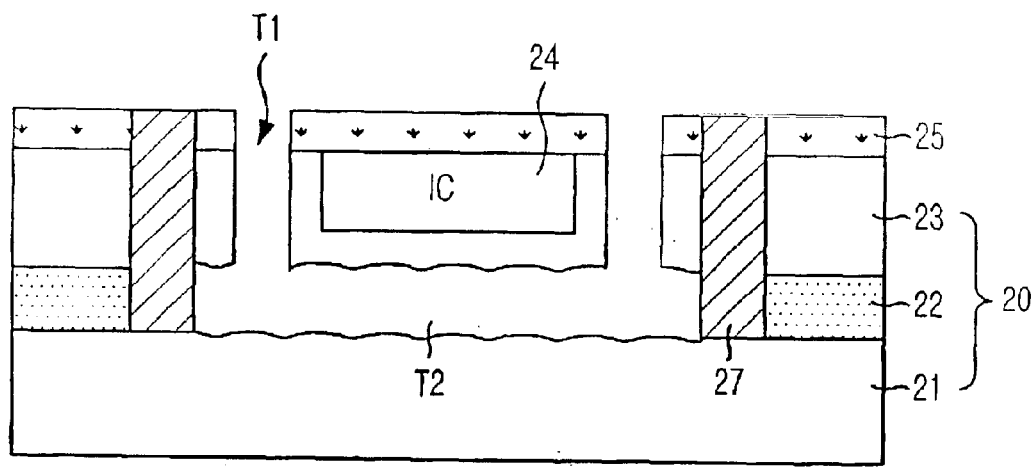

Referring to FIG. 4J, unevenness is formed on the upper and lower part of the tunneling region T1 by performing a gas phase etching using a silicon etching source, or a dry etching. Here, for the silicon-etching source, at least one selected from a group consisting of HBr, He, $O_2$, $N_2$, $SF_6$, $CF_4$, $SiF_4$, $BCl_3$, $Cl_2$, $NF_3$, $CHF_3$, $C_2F_6$, and $C_2ClF_5$ gases.

Figure 4K:
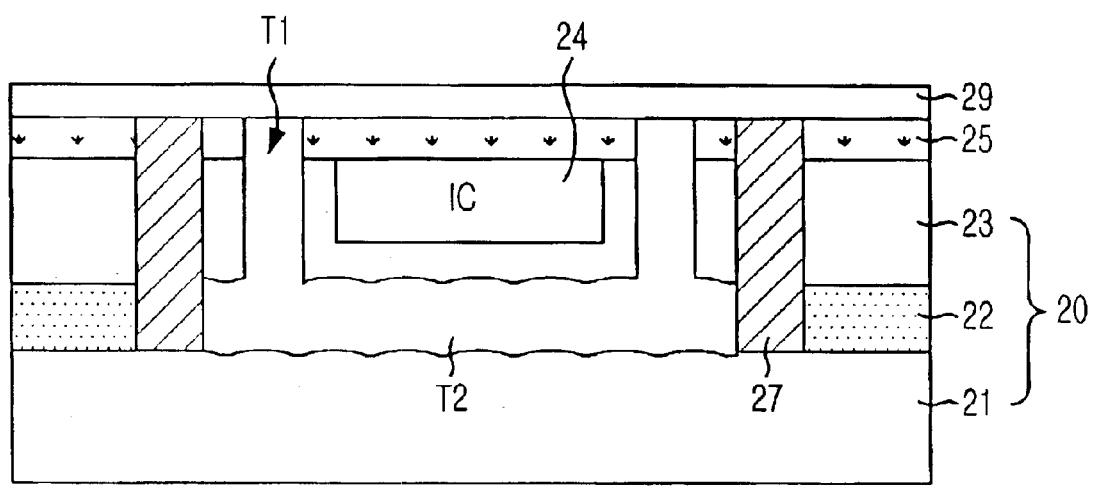

Referring to FIG. 4K, a silicon oxide 29 is deposited on the top of the entire surface to close the entrance of the trench region T1. Here, if the entrance of the trench region T1 is not formed overly big, the entrance of the trench region T1 is closed in the process of depositing the silicon oxide layer 29, so it becomes very easy to close the entrance. If the air or other gases are used as an ambient gas of a reactor for depositing the silicon oxide layer 29, the trench region T1 and the tunneling region T2 can be filled up with the air or other gases having a high heat conductivity. The heat conductivity can be increased by performing metallic coating on the surface of the trench region T1 and the tunneling region T2. Desirably, the metallic coating is performed by putting a metallic source material in the trench region T1 and the tunneling region T2 and performing a thermal treatment at an appropriate temperature. The silicon oxide layer 29 can be substituted by an insulation material, such as a silicon nitride, polymer and polyimide.

Subsequently, when the silicon oxide layer 29 in the trench region T1 is removed optionally, the cross-section of FIG. 3 can be obtained.

As described above, the semiconductor device and the fabrication method of the present invention can release the heat generated in the semiconductor device to the outside so quickly that no separate fan or a heat release plate is required. Therefore, the semiconductor device and the fabrication method of the present invention can be applied to a semiconductor parts that generates a lot of heat when the devices are operated.

While the present invention has been described with respect to certain preferred embodiments, it will be apparent to those skilled in the art that various changes and modifications may be made without departing from the scope of the invention as defined in the following claims. For example, in the embodiment of the present invention shows that an oxide layer is used as the buried insulation layer of the SOI substrate, but the device and method of the present invention can be applied to cases where other type of insulation layer is used as the buried insulation layer.

What is claimed is:

1. A semiconductor device, comprising:
   a silicon-on-insulator (SOI) substrate including a bottom silicon substrate, a buried insulation layer and a top silicon layer;
   an integrated circuit formed on the top silicon layer of the SOI substrate;
   a tunnel region formed between the bottom silicon substrate and the top silicon layer, which are under the integrated circuit; and
   an unevenness formed on the surfaces of the bottom silicon substrate and the top silicon layer that from the tunnel region.

2. The semiconductor device as recited in claim 1, further comprising one or more openings for penetrating the top silicon layer around the integrated circuit and exposing the tunneling region.

3. The semiconductor device as recited in claim 2, further comprising an insulation layer for closing the entrance to the openings on the SOI substrate.

4. The semiconductor device as recited in claim 2, further comprising a barrier layer, which is inserted to the buried insulation layer and the top silicon layer around the integrated circuit, for including the openings inside.

5. The semiconductor device as recited in claim 4, wherein the barrier layer includes polysilicon or metallic material.

6. The semiconductor device as recited in claim 1, wherein the buried insulation layer is formed of a silicon oxide.

7. A method for fabricating a semiconductor device, comprising the steps of:
   a) preparing an SOI substrate including a bottom silicon substrate, a buried insulation layer and a top silicon layer;
   b) forming an integrated circuit on the top silicon layer of the SOI substrate; and
   c) forming a tunnel region between the bottom silicon substrate and the top silicon layer, which are under the integrated circuit
      wherein the steps c) include the steps of:
      c1) forming a first trench that penetrates the buried insulation layer and the top silicon layer around the integrated circuit at a predetermined distance and exposes the bottom silicon substrate:
      c2) burying, a barrier material in the first trench;
      c3) forming second trench that penetrates the top soil silicon layer between the first trench and the integrated circuit and exposes the buried insulation layer;
      c4) removing the buried insulation layer inside a region defined by the first trench; and
      c5) forming unevenness on the surfaces of the bottom silicon substrate and the top silicon layer that form the tunnel region.

8. The method as recited in claim 7, further including a step of closing the entrance of the second trench by forming an insulation layer on the SOI substrate, after the step of removing the buried insulation layer.

9. The method as recited in claim 8, further including a step of closing the entrance of the second trench by etching the insulation layer of the second trench region optionally.

10. The method as recited in claim 8, further including a step of filling the air or other gases into the inside of the tunneling region and the second trench.

11. The method as recited in claim 7, wherein the barrier material includes polysilicon or metallic material.

12. The method as recited in claim 11, wherein the buried insulation layer is formed of a silicon oxide.

13. The method as recited in claim 12, wherein the buried insulation layer is removed by using the barrier material as an etching barrier layer and performing a gas phase etching using such gases as HF and BHF.

14. The method as recited in claim 7, wherein the unevenness is formed by performing a gas phase etching or a dry etching using a silicon-etching source.

15. The method as recited in claim 14, wherein the silicon-etching source includes at least any one selected from a group consisting of HBr, He, $O_2$, $N_2$, $SF_6$, $CF_4$, $SiF_4$, $BCl_3$, $Cl_2$, $NF_3$, $CHF_3$, $C_2F_6$, and $C_2ClF_5$ gases.

16. The method as recited in claim 14, wherein the insulation layer includes at least ant one group consisting of a silicon oxide, a silicon nitride, polymer and polyimide.

* * * * *